United States Patent [19]

Mariani

[11] Patent Number: 5,469,170

[45] Date of Patent: Nov. 21, 1995

[54] PASSIVE SAW-ID TAGS USING A CHIRP TRANSDUCER

[75] Inventor: Elio A. Mariani, Hamilton Square, N.J.

[73] Assignee: The United States of America as represented by the Secretary of the Army, Washington, D.C.

[21] Appl. No.: 326,553

[22] Filed: Oct. 20, 1994

[51] Int. Cl.$^6$ .................... G01S 13/80; H01L 41/08
[52] U.S. Cl. .................. 342/51; 342/44; 310/313 R; 310/313 D
[58] Field of Search .................. 310/313 R, 313 B; 342/44, 51; 340/825.54, 825.69

[56] References Cited

U.S. PATENT DOCUMENTS

| | | | |
|---|---|---|---|
| 3,706,094 | 12/1972 | Cole et al. | 342/44 |
| 4,734,698 | 3/1988 | Nysen et al. | 342/44 |
| 4,737,790 | 4/1988 | Skeie et al. | 342/51 |
| 4,746,830 | 5/1988 | Hollandd | 310/313 D |
| 4,951,057 | 8/1990 | Nagel | 342/51 |

OTHER PUBLICATIONS

L. Reindl and W. Ruile, Programmable Reflectors for SAW–ID Tags, IEEE Ultrasonics Symposium (1993), 6 pages.

Primary Examiner—Ian J. Lobo
Attorney, Agent, or Firm—Michael Zelenka; George B. Tereschuk

[57] ABSTRACT

A Passive Surface Acoustic Wave Identification Tag ("SAW-ID tag") device utilizes pulse compression techniques and a large number of coding possibilities for identifying articles at enhanced ranges. The SAW-ID tag device provides a piezoelectric substrate having bus bars, spaced electrode taps between the bus bars and a built-in antenna, with an input chirped SAW transducer having a dispersive, complementary matched filter response to an input expanded chirp signal from an expanded linear FM chirp waveform actively generated by a nearby chirp transmitter. The input expanded chirp signal is fed into the input chirped SAW transducer through the built-in antenna, to compresses the input expanded chirp signal into a narrow, compressed pulse signal propagating toward the electrodes taps. The spacing of the electrode taps establishes the desired unique time-ordered coding. The electrode taps sample the narrow, compressed pulse signal and provide narrow, compressed pulse samples propagating a coded, pulse train output transmitted via the antenna to a nearby interrogation means to identify the tagged article. The preferred embodiment is an SAW-ID tag device with a piezoelectric quartz substrate about 1 inch long, a built-in dipole antenna and five (5) spaced electrode taps, establishing several million coding possibilities. Also disclosed are methods of identifying articles using an SAW-ID tag device, and methods of selectively disconnecting and connecting electrodes to facilitate mass production.

48 Claims, 4 Drawing Sheets

PASSIVE SAW-ID TAGS USING A CHIRP TRANSDUCER

GOVERNMENT INTEREST

The invention described herein may be manufactured, used and licensed by or for the Government of the United States of America without the payment to me of any royalties thereon.

BACKGROUND OF THE INVENTION

1. Field of the Invention

This invention relates to the field of remote, electronic identification using passive, RF Surface Acoustic Wave tagging devices. More particularly, this invention relates to a low-cost, miniaturized device with enhanced range that allows for a great number of codes to be placed on a Surface Acoustic Wave identification (SAW-ID) tag.

2. Description of the Prior Art

SAW devices are employed in identification systems, known as either SAW-ID tags or SAW wireless labels. The operating principle of these devices is well-known in the prior art: an incoming electromagnetic signal is received through an antenna by a transducer which launches a surface acoustic wave, which is encoded by structures on the surface of the device and propagated back to the transducer where the surface acoustic wave is reconverted into an electromagnetic signal and transmitted through the antenna.

These SAW-ID tag devices have numerous applications for logistics, material, personnel and vehicular identification and tracking, in both civilian and military environments, as well as identifying and tracking livestock, wildlife and other animals. Other possible or actual applications for SAW-ID tag devices include sorting luggage, mail or parcels, and preventing theft of books from a library or merchandise by tagging the item with a coded label and locating a receiver near an exit to detect unauthorized passage of a tagged article. See for example, U.S. Pat. No. 3,706,094 entitled "Electronic Surveillance System" issued to Cole and Vaughan on Dec. 12, 1972.

It is also known in the prior art that the outgoing signal can be coded by the placement of reflectors in an acoustic path, see for example a paper entitled "Programmable Reflectors for SAW-ID Tags", by L. Reindl and W. Ruile printed in the 1993 IEEE Ultrasonics Symposium. That paper notes that SAW-ID tags can replace bar codes and that Norway has implemented an RF vehicle identification system.

Those concerned with the development of SAW-ID tags have long recognized the need for a smaller and more versatile SAW-ID tag with enhanced range capability. Typically, SAW-ID tag devices are limited to a conveniently small size that will accommodate an array of codes on the device numbering in the millions but have a limited range of about 10–20 feet. Current size, range and cost limitations consequently restrict the applications for this technology. The aforementioned paper observed that while SAW-ID technology was in use or under development in several locations "the big breakthrough for SAW-ID tags has not yet occurred."

This invention provides a solution to the barriers of SAW-ID tags by addressing the current demand for a more versatile, low-cost, miniature SAW-ID technology, and the need for small labels with a much enhanced range, having a higher number of possible coded locations. This invention fulfills this need by utilizing pulse compression techniques with a significant processing gain for an enhanced range such that a one inch long SAW-ID tag could provide many as 1,000,000 code possibilities. Current SAW-ID tag devices operate in a range of about 10 feet, while the SAW-ID tag device of this invention offers a tenfold increased range. A key aspect of the ability to both miniaturize the SAW-ID tag and increase its effective range is the utilization of a nearby "chirp" transmitter that provides the necessary FM waveform (i.e. linear or nonlinear FM) to the input transducer through a built-in antenna on the SAW-ID tag.

SUMMARY OF THE INVENTION

It is an object of this invention to provide a low-cost, small SAW-ID tag utilizing a nearby chirp waveform transmitter that feeds the necessary FM waveform to the input transducer through a built-in antenna.

It is a further object of this invention to provide a low-cost, small SAW-ID tag utilizing pulse compression techniques which significantly enhances the range and provides a large number of code possibilities.

It is still a further object of this invention to provide a number of methods for using SAW-ID tag devices utilizing pulse compression techniques with a significantly enhanced range and a large number of code possibilities, including methods of achieving significant variations in coding possibilities in a mass production environment by either selectively disconnecting or connecting electrodes.

To attain these and other objects, the present invention contemplates an SAW-ID tag device having an input SAW transducer that compresses the input chirp signal; the resulting compressed pulse signal then propagates toward a plurality of appropriately spaced electrodes which establish the desired tag coding.

More specifically, the present invention comprises an SAW-ID tag device that responds to an expanded linear frequency-modulated (FM) chirp waveform actively generated by a nearby chirp transmitter, an input chirped SAW transducer having a chirp designed to compress the "matched" input chirp signal, said chirp FM waveform being fed into an input chirped SAW transducer through a built-in antenna, said input chirped SAW transducer responding to the input signal and converting the input expanded chirp signal into a compressed narrow pulse signal propagating towards a plurality of appropriately spaced electrodes, which act as taps, that establish the desired time-ordered coding irrespective of how the SAW-ID tag device is constructed. Accordingly, the present invention will possess all the advantages of smaller SAW-ID tags by having both a greater range and a large number of code possibilities, but without the disadvantages of the larger and limited range SAW-ID tag devices previously developed.

The SAW-ID tag device of the present invention can be used in a variety of applications for logistics, material, personnel and vehicular identification and tracking, including identifying and tracking livestock and wildlife, in both civilian and military environments. Due to the potential for both decreased size and increased range and coding possibilities of this invention, detecting and preventing the unauthorized passage of any tagged article is now more readily possible. This invention provides a device offering a tenfold increase in range, which should dramatically expand the number of possible applications.

In general, the present invention includes an expanded linear frequency-modulated (FM) chirp waveform actively generated by a chirp transmitter in proximity to the SAW-ID tag device, said SAW-ID tag device having a piezoelectric substrate with an input chirped SAW transducer thereon, said input chirped SAW transducer responding to the input expanded chirp signal, said chirp FM waveform being fed into said input chirped SAW transducer through a built-in antenna, said input chirped SAW transducer providing a dispersive, complementary (i.e. matched) response to the input expanded signal which compresses the input expanded chirp signal into a narrow pulse, resulting in a compressed pulse signal propagating toward a plurality of appropriately spaced electrodes, acting as taps, which establish the desired time-ordered coding that identifies the article upon which the device is disposed, that possesses all the advantages of greater range and large number of code possibilities, yet suffers from none of the disadvantages of the larger and range-limited SAW-ID tag devices developed heretofore.

In the preferred embodiment, the invention is an SAW-ID tag device having a piezoelectric quartz substrate about 1 inch in length, an input chirped SAW transducer responding to the input expanded linear FM chirp signal actively generated by a companion transmitter in proximity to the device, said chirp FM waveform being fed into an input chirped SAW transducer through a built-in dipole antenna, said input chirped SAW transducer providing a dispersive, complementary response to the input expanded chirp signal that compresses or collapses the input expanded chirp signal into a narrow pulse, resulting in the compressed pulse signal propagating toward a plurality of five (5) appropriately spaced electrodes, acting as taps, which establish the desired coding identifying the tagged article.

Also disclosed are methods of identifying articles using an SAW-ID tag device, as well as methods of selectively disconnecting and connecting electrodes in order to facilitate device fabrication with a number of code possibilities.

The term "SAW" as used throughout this specification should be considered to refer to Surface Acoustic Wave, which is defined as an acoustic, Rayleigh wave, that propagates along a surface of an elastic substrate, whose amplitude decays exponentially with the substrate depth.

The term "chirp" as used throughout this specification should be considered to refer to a linear, frequency-modulated waveform whose group delay is a nonconstant function of instantaneous frequency.

The terms "nearby" or "in proximity" as used throughout this specification in connection with the placement of the SAW-ID tag device in relation to the chirp transmitter should be considered to refer to any distance greater than the current range of 10 feet that is still in the general proximity.

The terms "temperature-stable characteristics" and "temperature-stable properties" as used throughout this specification should be considered to refer to the temperature coefficient of the substrate material; this coefficient measures the frequency change of the device (in ppm) with each degree (° C.) change in temperature.

These definitions should also apply in conjunction with any other commonly accepted definitions of those terms.

BRIEF DESCRIPTION OF THE DRAWINGS

The exact nature of this invention as well as other objects and advantages thereof will be readily apparent from consideration of the following specification relating to the annexed drawings.

DETAILED DESCRIPTION OF THE DRAWINGS

Figure 1:
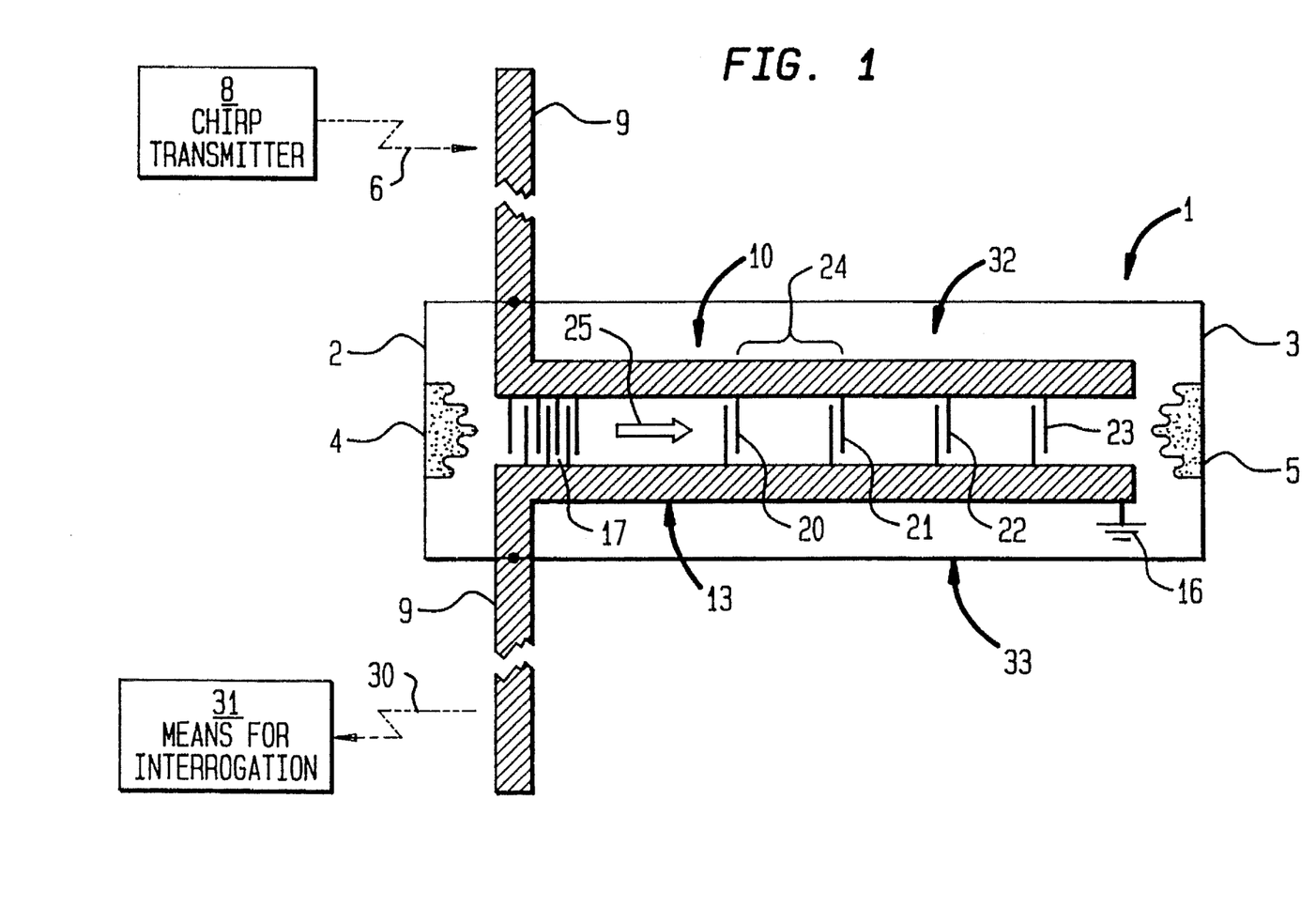
FIG. 1 is a top view of the SAW-ID tag configuration of this invention.

Referring now to the drawings, there is shown in FIG. 1 a top view of the SAW-ID tag configuration utilized in all embodiments of this invention. FIG. 1 depicts a device having a piezoelectric substrate 1 with temperature-stable characteristics, having a polished top surface 32, a bottom surface 33, a left end 2 and a right end 3, respectively, with acoustic absorber 4 disposed on said left end 2 and acoustic absorber 5 disposed on said right end 3, respectively. An expanded linear frequency-modulated (FM) chirp waveform 6 is actively generated by a transmitter, shown schematically as box 8 in the drawing, placed in proximity to the tag device. Also, a nonlinear FM waveform may be used as the input to the SAW-ID tag. A built-in antenna 9 receives said expanded chirp waveform 6 and is connected to an upper bus bar 10 and a lower bus bar 13, disposed on said top surface 32 of the piezoelectric substrate 1. In operation, said expanded chirp waveform 6 is fed by said antenna 9 to an input chirped SAW transducer 17, said input chirped SAW transducer 17 is connected to, and disposed between, said upper bus bar 10 and said lower bus bar 13, respectively, said input chirped SAW transducer 17 providing a dispersive, complementary "matched" filter response to the chirp waveform 6 input signal, compressing or collapsing the input expanded chirp signal into a narrow pulse, resulting in a compressed pulse signal, shown as arrow 25, propagating toward a plurality of appropriately spaced electrodes 20–23, respectively, acting as taps. Said electrode taps 20–23, respectively, being disposed between said upper bus bar 10 and said lower bus bar 13, respectively. A grounding means 16 is also connected to said lower bus bar 13.

Said electrode taps 20–23, respectively, comprise a predetermined number of electrodes per tap which are inversely proportional to the desired signal bandwidth. The positioning of electrode taps 20–23, respectively, from each other corresponds to particular positions in time, so that, for example, electrode taps 20, 21, 22, and 23; respectively, represent time positions $t_1$, $t_2$, $t_3$, . . . $T_n$. The separation between each pair of taps is known as $t_n$, and is depicted, for purposes of illustration, as separation space 24 between electrode taps 20 and 21, respectively, in FIG. 1. The positioning of electrode taps 20–23, respectively, determines a sequence of time-ordered signals, explained in relation to FIG. 2, which ultimately establish the desired unique identification coding. The relationship between the electrode taps 20–23, respectively, and any separation space, such as said separation space 24, will be described in greater detail in connection with FIG. 2 and several formulas below.

The compressed pulse signal 25 propagates toward said plurality of electrode taps 20–23, respectively, so that each of said electrode taps 20–23, respectively; detects or samples the compressed pulse signal 25. Based upon the separation space between each pair of taps, $T_n$, 24, as between electrode taps 20 and 21, respectively, each of said electrode taps 20–23, respectively, will detect a sample of the compressed pulse signal 25, such that a given number of electrode taps will produce a like number of narrow compressed pulse samples, or tap pulses, not shown, each of which will be separated in time by spacings $T_n$, where actual spacings between electrode taps would be discretely varied to establish a unique coded pulse train output 30 transmitted back to an interrogation means, depicted schematically as box 31, which identifies the tagged article.

In the FIG. 1 embodiment, the number of electrode taps may vary with consequential increase or decrease, as the case may be, in the number of coding possibilities. The piezoelectric substrate may be made of quartz, or any similar material having acceptable temperature-stable properties. The upper and lower bus bars 10 and 13, respectively, may be shaped in a generally linear fashion and should lie substantially parallel to one another. The input chirped SAW transducer 17 should be located on the polished top surface 32 of the piezoelectric substrate 1 in close proximity to the built-in antenna 9, spaced sufficiently away from the electrode taps so that the compressed pulse signal 25 does not overlap the narrow compressed pulse samples. The chirp transmitter 8 can be located about 100 feet away from the tagged articles and still operate effectively. The means for interrogation 31 may be a separate device or may operate together with the chirp transmitter 8 in any conventional combined transmitter/receiver configuration.

Figure 2:
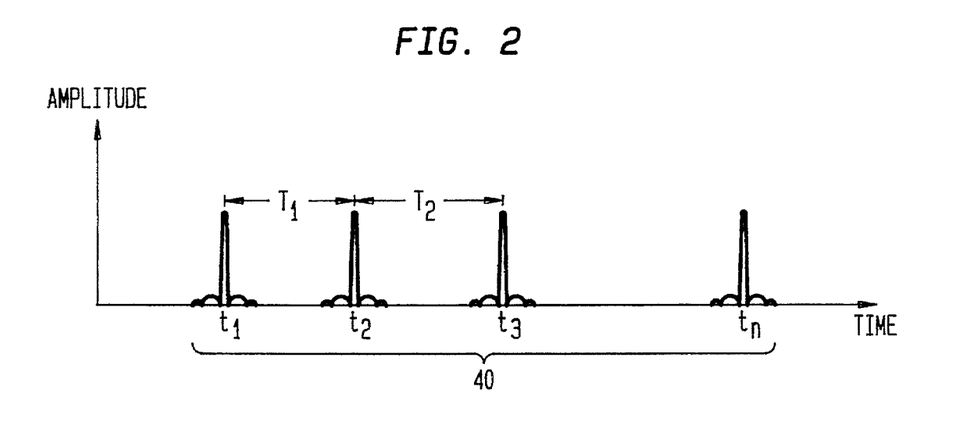
FIG. 2 is a schematic diagram depicting SAW tag signal output, applicable to all embodiments of this invention.

FIG. 2 is a schematic diagram of SAW-ID tag signal output depicting the spacing between compressed pulse samples utilized to establish a uniquely coded pulse train within the SAW-ID tag device, which is applicable to all embodiments of this invention. As described in connection with FIG. 1 above, the plurality of electrode taps 20–23, respectively, comprise a predetermined number of electrodes per tap inversely proportional to the desired signal bandwidth. FIG. 2 depicts time positions $t_1, t_2, t_3, \ldots t_n$ on a diagram depicting amplitude vs. time. The separation in time between each pair of taps is known as $T_n$, while $T_1$, and $T_2$ represent the time separating the first three (3) compressed pulses. Separation in time $T_n$ is a parameter used in establishing unique codes for each SAW-ID tag device. Based on this relationship, each FIG. 1 electrode tap will detect a sample of the compressed pulses such that n taps will produce n narrow compressed pulse samples, which will be separated in time by separation in time $T_n$, where the actual spacings would be discretely varied to establish a unique coded pulse train 40 shown in the FIG. 2 diagram. Based on these relationships, one can observe that as the number of taps is increased, the number of possible codes also increases into the millions, as described more fully below in connection with FIGS. 3 and 4.

Figure 3:
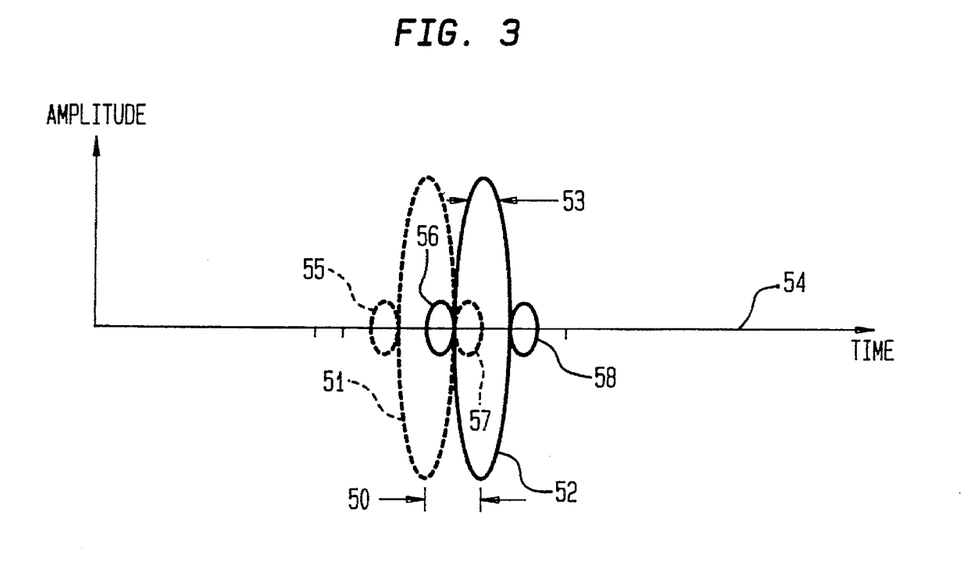
FIG. 3 is an enlarged view of the compressed pulse resolution associated with the SAW-ID tag configuration applicable to the preferred embodiment of this invention depicting minimum separations between two (2) compressed pulses.
Figure 4:
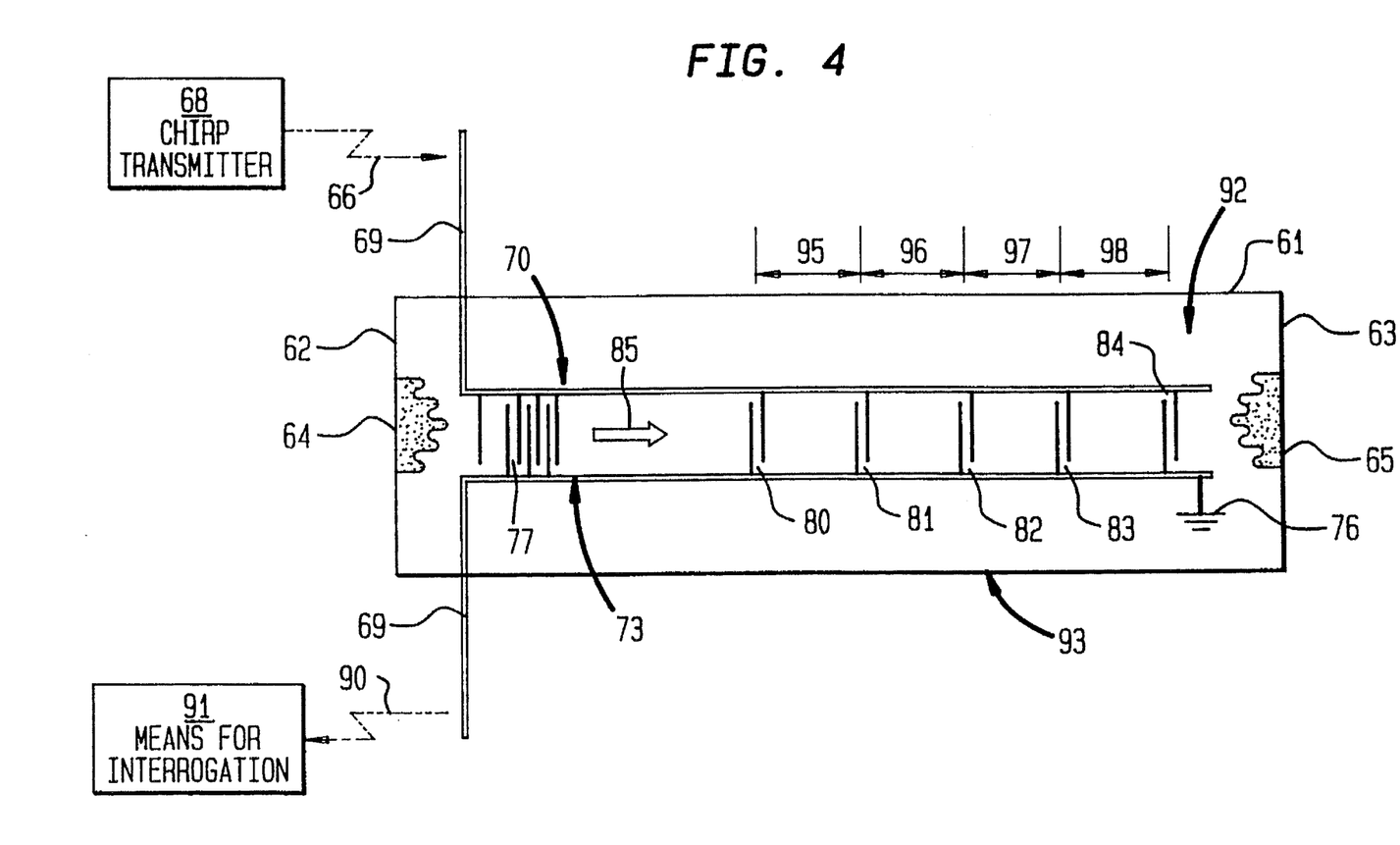
FIG. 4 is a top view of the SAW-ID tag configuration of the preferred embodiment of this invention utilizing five (5) electrode taps.

FIG. 3 is an enlarged view indicating the compressed pulse resolution applicable to all SAW-ID tag configurations of this invention depicting minimum separations between compressed pulses, while FIG. 4 is a top view of a five (5) electrode tap device utilized in the SAW-ID tag configuration of the preferred embodiment of this invention. Considering both of these figures together demonstrates the ability to achieve a massive number of codes for these SAW-ID tags with a tenfold effective increase in range, both of which are key aspects of this invention. FIG. 4 will be described in further detail below.

FIG. 3 depicts a minimum detectable separation 50 between compressed pulses 51 and 52, respectively, assuming the following SAW-ID tag parameters:

$$f_0 = 900 \text{ MHz (center frequency)}$$
$$\Delta f = 50 \text{ MHz (bandwidth)}$$
$$\frac{1}{\Delta f} = 20 \text{ nsec. (compressed pulsewidth)}$$
$$\Delta \tau = 2 \text{ μsec. (dispersive delay)}$$
$$(\Delta f)(\Delta \tau) = 100 \text{ (or 20 } dB \text{ processing gain)}$$
$$\frac{\Delta f}{f_0} = 0.056$$

If the minimum detectable separation between narrow compressed pulses is three (3) times the compressed pulse width, then the minimum separation is:

$$\frac{3}{\Delta f}$$

and the minimum detectable separation, or resolution, is:

$$\frac{3}{50 \text{ MHz}} = 60 \text{ nsec.}$$

Referring again to FIG. 3, having axes of amplitude vs. time, the 60 nanosecond resolution figure derived above corresponds to said minimum detectable separation 50, between compressed pulses 51 and 52, respectively, with a pulsewidth 53 and a nanosecond time scale 54. The lower amplitude pulses 55–58, respectively, depict the compressed pulse time sidelobes.

FIG. 3 demonstrates the potential resolution between overlapping compressed pulses that permits both an enhanced range and a great number of code possibilities for the purpose of constructing a more versatile SAW-ID tag device, while FIG. 4 provides an example of how many possibilities are actually provided by the five electrode tap configuration of the preferred embodiment of this invention.

Referring now to FIG. 4, the preferred embodiment of this invention, utilizing the same basic configuration as disclosed in FIG. 1, five (5) electrode taps 80–84, respectively, are provided. FIG. 4 depicts a device having a piezoelectric quartz substrate 61 with temperature-stable characteristics, having a polished top surface 92, a bottom surface 93, a left end 62 and a right end 63, respectively, having an acoustic absorber 64 disposed on said left end 62 and an acoustic absorber 65 disposed on said right end 63, respectively. An expanded linear frequency-modulated (FM) chirp waveform 66, represented by an arrow, is actively generated by a chirp transmitter, shown schematically as box 68 in FIG. 4, placed in proximity to said piezoelectric quartz substrate 61. Also, a non-linear FM waveform may be used as the input to the SAW-ID tag. A built-in antenna 69 receives said chirp waveform 66 and is connected to an input chirped SAW transducer 77, an upper bus bar 70 and a lower bus bar 73. A grounding means 76 is provided to said lower bus bar 73.

In operation, said input chirp waveform 66 is fed by said antenna 69 to said input chirped SAW transducer 77, said input chirped SAW transducer 77 is connected to, and disposed between, said upper bus bar 70 and said lower bus bar 73, respectively. Said input chirped SAW transducer 77 provides a dispersive, complementary "matched" filter response to the expanded chirp waveform 66 input signal which then compresses or collapses the input expanded chirp signal into a narrow pulse, resulting in the compressed pulse signal depicted by arrow 85, propagating toward five (5) appropriately spaced electrodes 80–84, respectively, acting as taps. Said electrode taps 80–84, respectively, being connected between said upper bus bar 70 and said lower bus bar 73, respectively, and positioned from each other in a way that determines time-ordered signals, not shown in this figure, which ultimately establish the desired unique identification coding. The five (5) electrode taps 80–84, respectively, comprise the predetermined number of electrodes per tap which is inversely proportional to the desired signal bandwidth.

Four (4) separation spaces are shown alongside said piezoelectric quartz substrate 61, as separation space 95, separation space 96, separation space 97 and separation space 98, respectively. The compressed pulse signal 85, having a width approximately equal to the reciprocal of the bandwidth of the FM transmitted input expanded signal 66, propagates toward said five (5) electrode taps 80–84, respectively, so that each of said five (5) electrode taps 80–84, respectively, detects or samples the compressed pulse signal 85, such that a given number of electrode taps, five (5) in the preferred embodiment, will produce a like number of narrow compressed pulse samples, each of which will be separated in time by said separation spaces 95–98, respectively, to establish a unique, time-ordered coded pulse train output 90 represented by an arrow, transmitted via said antenna 69 back to an interrogation means, depicted schematically as box 91, which identifies the tagged article.

Said separation spaces 95–98, respectively, designated mathematically as $T_1$, $T_2$, $T_3$ and $T_4$ are utilized and further employed as expressions in the formulas below in order to calculate the number of possible code combinations.

In the formula below, c represents combinations, n events are taken r at a time. Let the maximum separation for each T interval be 1μ second ($T_1=T_2=T_3=T_4=1\mu$ sec.).

$$c = \frac{n!}{r!(n-r)!}$$

$$T_1 = T_2 = T_3 = T_4 = 1 \text{ μsec.} = 1,000 \text{ nsec.}$$

$$1 \text{ μsec.} \cdot \frac{1000 \text{ nsec.}}{60 \text{ nsec.}}$$

$$\simeq 16 \text{ resolveable time slots per } T \text{ interval}$$

$$c = \frac{(16+16+16+16)!}{4!(60)!}$$

$$\frac{64!}{4!(60)!} = 635,000 \text{ possible time slots}$$

When $T_1=2\mu$ sec., and $T_2=T_3=T_4=1\mu$ sec., the calculation is as follows:

$$\frac{2 \text{ μsec.}}{60 \text{ nsec.}} = 33 \, T_1 \text{ time slots}$$

$$c = \frac{(33+16+16+16)!}{43!(77)!}$$

$$= \frac{81!}{4!(77)!}$$

$$= 1.66 \times 10^6 \text{ pssible time slots}$$

These formulas demonstrate the feasibility of producing an SAW-ID tag that is about 8μ seconds long in terms of time, or a substrate about 1.1 inch long in terms of physical distance.

For the assumed SAW-ID tag parameters, a fractional bandwidth ($\Delta f/f_o$) of 5.6% makes quartz an appropriate piezoelectric substrate. Thus, the FIG. 4 configuration of the preferred embodiment, utilizing pulse compression techniques and the above formulas indicate that an SAW-ID tag could be fabricated on a quartz substrate no longer than 1.1 inch, which would yield an enhanced range but relatively low-cost device. It is also within the scope of this disclosure and the appended claims to advantageously use piezoelectric substrates comprising materials other than quartz, so long as they possess the appropriate temperature-stable characteristics. Similarly, it is also within the scope of this disclosure and the appended claims to advantageously use substrates of different sizes and with differing coding possibilities.

In the FIG. 4 preferred embodiment of the SAW-ID tag device, the spacing of the electrode taps 80–84, respectively, has a tap resolution of 60 nanoseconds, which corresponds to 0.0075 inch, or 0.019 cm for a quartz substrate. An SAW-ID tag with a total tap delay ($\Sigma_1 T_n$) of 4μ seconds would then have 67 potential electrode taps spaced by 0.0075 inch center-to-center. The FIG. 4 preferred embodiment of the SAW-ID tag could be mass-produced in this configuration with a full array of 67 electrode taps, or a lesser number.

In the FIG. 4 preferred embodiment, the number of electrode taps may vary from five (5) with consequential increase or decrease, as the case may be, in the number of coding possibilities. The piezoelectric quartz substrate can comprise not only quartz, but any similar substance having acceptable temperature-stable properties. The upper and lower bus bars 70 and 73, respectively, may be shaped in a generally linear fashion and should be mounted on the substrate substantially parallel to one another. The input chirped SAW transducer 77 should be located on the piezoelectric quartz substrate 61 in close proximity to the dipole antenna 69, spaced sufficiently away from the electrode taps 80–84 so that the compressed (input) pulse signal 85 does not overlap the narrow compressed pulse samples. The antenna 69, may either be a dipole type, or a loop antenna, or any other similar antenna so long as it is built into the tag device and connected to said input chirped SAW transducer 77 and said bus bars 70 and 73. The chirp transmitter 68 can be located about 100 feet away from the tagged articles and still operate effectively. The means for interrogation 91 may be a separate device or may operate together with the chirp transmitter 68 in any conventional combined transmitter/receiver configuration. In operation of the FIG. 4 configuration, while only five (5) electrode taps are depicted as electrically connected to said upper and lower bus bars, the FIG. 4 configuration allows a full array of 67 possible electrode tap positions to permit mass production.

Figure 5:
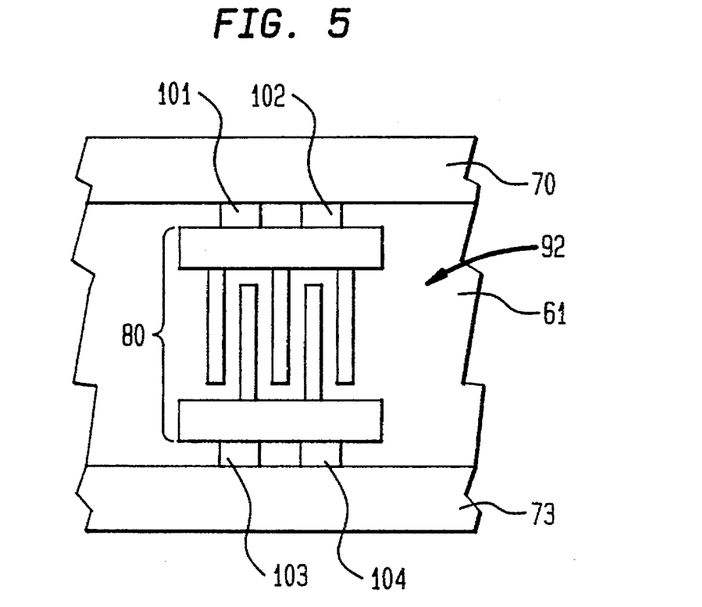
FIG. 5 is an expanded top view of an SAW-ID tag tap depicting a method of this invention for achieving significant variations in coding possibilities by the selective disconnecting of electrode taps.
Figure 6:
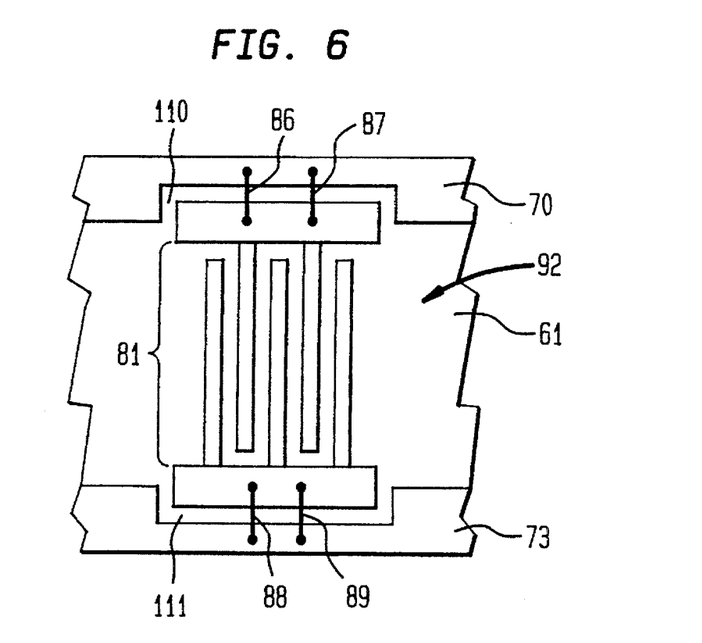
FIG. 6 is an expanded top view of an SAW-ID tag showing a method of this invention for achieving significant variations in coding possibilities by the selective connecting of electrode taps.

FIGS. 5 and 6, respectively, address methods of this invention for achieving significant variations in coding possibilities in a mass production environment by either connection or disconnection of the available electrode taps, and will be discussed in further detail below.

The present invention also encompasses a method of identifying articles using an SAW-ID tag device. This method comprises the steps of selecting a piezoelectric substrate with temperature-stable characteristics having a polished top surface and a bottom surface; forming an input chirped SAW transducer on said top surface of the piezoelectric substrate, said input chirped SAW transducer being capable of providing a dispersive, complementary "matched" filter response to a chirp waveform input signal; connecting a built-in antenna, an upper bus and a lower bus bar to said input chirped SAW transducer; forming said upper bus bar and said lower bus bar, respectively; in a generally linear fashion running substantially parallel to each other; disposing a plurality of electrode taps on said top surface of the piezoelectric substrate between said upper bus bar and lower bus bar, respectively; spacing said electrode taps at selected distances from each other and between said upper bus bar and lower bus bar, thereby determining a sequence of time-ordered signals which ultimately forms a unique identification code; generating an expanded linear frequency-modulated (FM) "chirp" waveform front a chirp transmitter as an expanded input chirp signal; feeding said expanded input chirp signal through said built-in antenna to said input chirped SAW transducer; said expanded input chirp signal being compressing by said SAW chirped transducer into a narrow compressed pulse signal; propagating said narrow compressed pulse signal toward said plurality of electrode taps forming said desired code on said top surface of the piezoelectric substrate; allowing the plurality of electrode taps to detect or sample the narrow compressed pulse signal; allowing the plurality of electrode taps to produce a plurality of narrow compressed pulse samples; propagating a uniquely coded time-ordered pulse train output through said built-in antenna back to a means for interrogation identifying the tagged article. This method of identifying articles using an SAW-ID tag device can be accomplished using either configuration of the preferred embodiment depicted in FIG. 4 or the basic FIG. 1 embodiment. Variations of this method will be addressed further below.

The present invention also encompasses an additional method for establishing the desired time-ordered code for an SAW-ID tag device where a plurality of available tap electrodes are selectively disconnected to allow the remaining connected electrode taps to respond to the compressed or collapsed pulse signal via standard pulse compression techniques. This additional method comprises the steps of selecting a piezoelectric substrate with temperature-stable characteristics, having a polished top surface and a bottom surface; forming an input chirped SAW transducer on said top surface of the piezoelectric substrate, said input chirped SAW transducer being capable of providing a dispersive, complementary "matched" filter response to a chirp waveform input signal; connecting a built-in antenna, an upper bus and a lower bus bar to said input chirped SAW transducer; forming said upper bus bar and said lower bus bar, respectively, in a generally linear fashion running substantially parallel to each other; disposing a plurality of electrode taps between said upper bus bar and said lower bus bar; forming a plurality of connected electrode taps with upper and lower connective portions connecting said electrode taps to said upper and lower bus bars, respectively; spacing said plurality of connected electrode taps at selected distances from each other between said upper and lower bus bars; selectively disabling a plurality of said connected electrode taps by disconnecting a plurality of said connective portions of said electrode taps from said upper and lower bus bars, respectively, thereby forming a set of operational electrode taps thereby determining a sequence of time-ordered signals which ultimately forms a unique identification code; generating an expanded linear frequency-modulated (FM) "chirp" waveform from a chirp transmitter as an expanded input chirp signal; feeding said expanded input chirp signal through said built-in antenna to said input chirped SAW transducer; said expanded input chirp signal being compressed by said SAW chirped transducer into a narrow compressed pulse signal; propagating said narrow compressed pulse signal toward said set of operational electrode taps forming said desired code on said top surface of the piezoelectric substrate; allowing said set of operational electrode taps to detect or sample portions of the narrow compressed pulse signal; allowing said set of operational electrode taps to produce a plurality of narrow compressed pulse samples; propagating a uniquely coded time-ordered pulse train output through said built-in antenna back to a means for interrogation identifying the tagged article. The selective disconnection aspect of this additional method of the present invention will be described in greater detail in connection with FIG. 5 below.

Referring now to FIG. 5, the operation of this additional method providing selective disconnecting of available electrode taps, is disclosed. FIG. 5 is an expanded top view of a tap section of the FIG. 4 configuration showing said top surface 92 of the piezoelectric quartz substrate 61 with said upper bus bar 70 and said lower bus bar 73, running substantially parallel to each other, both being disposed on said top surface 92 of the piezoelectric quartz substrate 61. Interspersed between said upper 70 and lower 73 bus bars, respectively, is, for illustration purposes, a connected electrode tap 80, having upper connective portions 101 and 102, respectively, serving to connect said upper bus bar 70 to said connected electrode tap 80 and lower connective portions 103 and 104, respectively, serving to connect said lower bus bar 73 to said electrode tap 80. Said connective portions 101, 102, 103 and 104, respectively, being electrically conductive. In this arrangement, where connected electrode tap 80 is fabricated with upper connective portions 101 and 102, respectively, and lower connective portions 103 and 104, respectively, said connective portions 101, 102, 103 and 104, respectively, may be disconnected by a laser scribe or other similar cutting means. For purposes of illustration, when said connective portions 101, 102, 103 and 104, respectively, are all disconnected from both of said upper and lower bus bars 70 and 73, respectively, that particular electrode tap 80 is disabled. Similarly, when said connective portions 101, 102, 103 and 104, respectively, are undisturbed and remain connected to both of said upper and lower bus bars 70 and 73, respectively, that particular connected electrode tap 80 becomes an operational electrode tap within said set of operational electrode taps which will detect the narrow compressed pulse signal propagated by this method. This method establishes a uniquely coded time-ordered pulse train output which would then be transmitted back to an interrogation means, in order to identify the tagged article, in accordance with either previously disclosed embodiment of this invention.

This method of identifying articles using an SAW-ID tag device with selectively disconnected electrode taps can be accomplished using either the configuration of the preferred embodiment depicted in FIG. 4 or the basic FIG. 1 embodiment. Variations of this method will be addressed further below.

Further, the present invention also encompasses another method for establishing the desired time-ordered code for an SAW-ID tag device where available tap electrodes are selectively connected to bus bars on the top surface of the piezoelectric substrate by a plurality of conductive wire bonds allowing only the selectively connected electrode taps to respond to the compressed or collapsed pulse signal via standard pulse compression techniques. This other method comprises the steps of selecting a piezoelectric substrate with temperature-stable characteristics, having a polished top surface and a bottom surface; forming an input chirped SAW transducer on said top surface of the piezoelectric substrate, said input chirped SAW transducer being capable of providing a dispersive, complementary "matched" filter response to a chirp waveform input signal; connecting a built-in antenna, an upper bus and a lower bus bar to said input chirped SAW transducer; forming a plurality of electrode taps having a plurality of top conductive wire bonds and a plurality of bottom conductive wire bonds for connecting said electrode taps to said upper and lower bus bars, respectively; forming said upper bus bar and said lower bus bar, respectively, in a generally linear fashion with a plurality of opposing slots dimensioned to accept said plurality of top wire conductive bonds and said plurality of bottom wire conductive bonds, respectively; aligning said upper bus bar and said lower bus bar to run substantially parallel to each other on said top surface of the piezoelectric substrate; selectively connecting said plurality of top wire conductive bonds and said plurality of bottom wire conductive bonds, respectively, of the electrode taps to said upper and lower bus bars, respectively, to form a plurality of connected electrode taps at predetermined distances from each other on said piezoelectric substrate, thereby determining a sequence of time-ordered signals which ultimately forms a unique identification code; generating an expanded linear frequency-modulated (FM) "chirp" waveform from a chirp transmitter as an expanded input chirp signal; feeding said expanded input chirp signal through said built-in antenna to said input chirped SAW transducer; said expanded input chirp signal being compressed by said input chirped SAW transducer into a narrow compressed pulse signal; propagating said narrow compressed pulse signal toward said plurality of connected electrode taps on said top surface of the piezoelectric substrate; allowing the plurality of connected electrode taps to detect or sample portions of the narrow compressed pulse signal; allowing the plurality of connected electrode taps to produce a plurality of narrow compressed pulse samples; and propagating a uniquely coded time-ordered pulse train output to said built-in antenna back to a means for interrogation identifying the tagged article. The selective connection aspect of this other method of the present invention will be described in greater detail in connection with FIG. 6 below.

Referring now to FIG. 6, the operation of this other method allowing selective connecting of electrode taps, is disclosed. FIG. 6 is an expanded top view of a tap section of the FIG. 4 configuration showing said top surface 92 of the piezoelectric quartz substrate 61 with said upper bus bar 70 and said lower bus bar 73, running substantially parallel to each other, both being disposed on said top surface 92 of the piezoelectric quartz substrate 61. Said upper bus bar 70 having a slot 110 and said lower bus bar 73 having a slot 111, said slots 110 and 111, respectively, opposing each other and being dimensioned to accept said electrode tap 81, as well as a plurality of top conductive wire bonds, shown as 86 and 87, respectively, of said electrode tap 81 in said slot 110, and a plurality of bottom conductive wire bonds, shown as 88 and 89, of said electrode tap 81 in said slot 111, respectively. Said top conductive wire bonds 86 and 87, respectively, and said bottom conductive wire bonds 88 and 89, respectively, are provided in order to selectively form electrical connections between said upper bus bar 70 and said lower bus bar 73, respectively, and said electrode tap 81. Where said electrode tap 81 is fabricated with said top conductive wire bonds 86 and 87, respectively, disposed within said opposing slot 110 of the upper bus bar 70 and said bottom conductive wire bonds 88 and 89, respectively, disposed within said opposing slot 111 of the lower bus bar 73, a desired coding element has been established. In operation, said electrode tap 81 may be selectively connected to said upper and lower bus bars 70 and 73, respectively, by other similar connective means. For purposes of illustration, said electrode tap 81 is shown as being connected to said upper bus bar 70 with said top conductive wire bonds 86 and 87, respectively, disposed within said opposing slot 110 of the upper bus bar 70 and said top conductive wire bonds 86 and 87, respectively, bridging from said electrode tap 81 to said upper bus bar 70, as well as said bottom conductive wire bonds 88 and 89, respectively, disposed within said opposing slot 111 of the lower bus bar 73, and said bottom conductive wire bonds 88 and 89, respectively, bridging from said electrode tap 81 to said lower bus bar 73.

This method of identifying articles using an SAW-ID tag device with selectively connected electrode taps can be accomplished using either the configuration of the preferred embodiment depicted in FIG. 4 or the basic FIG. 1 embodiment. Variations of these methods will be addressed below.

In any of these methods, the number of electrode taps disposed on said piezoelectric substrate may vary with consequential increase or decrease, as the case may be, in the number of coding possibilities. The piezoelectric substrate may be formed of quartz, or any similar substance having acceptable temperature-stable properties. The upper and lower bus bars may be formed in a generally linear fashion and should lie substantially parallel to one another. The input chirped SAW transducer should be disposed on the piezoelectric substrate in close proximity to the built-in antenna, but spaced sufficiently away from the electrode taps so that the compressed input pulse signal does not overlap the narrow compressed pulse samples. The chirp transmitter can be located about 100 feet away from the tagged articles and still operate effectively. The means for interrogation may be a separate device or may operate together with the chirp transmitter in any conventional combined transmitter/receiver configuration.

Further, in the disconnecting method the upper and lower connective portions should be formed of the same thin-film conductive material, such as aluminum, for example, as the rest of the metallic pattern forming the transducer, taps and bus bars. Similarly, in the method of selectively connecting electrode taps, the top and bottom conductive wire bonds may be formed via a conductive wire or constructed of a suitable conductive material.

Accordingly, having shown and described what are at present considered to be the preferred and several embodiments of this invention, it should be understood that the same have been shown by way of illustration and not limitation. It should be understood, of course, that the foregoing disclosure relates only to a small number of preferred embodiments and that numerous modifications or alterations may be made therein without departing from the spirit and scope of the invention as set forth in this disclosure and the appended claims. All modifications, alterations and changes coming within the spirit and scope of the invention are hereby meant to be included.

What I claim is:

1. An SAW-ID tag device, comprising:

a piezoelectric substrate with temperature-stable characteristics, having a top surface and a bottom surface;

an upper bus bar, a lower bus bar, a plurality of electrode taps and an input chirped SAW transducer disposed on said top surface of the piezoelectric substrate;

said input chirped SAW transducer being capable of providing a dispersive, complementary matched filter response to a chirp waveform input signal and being connected to said upper bus bar and said lower bus bar;

a built-in antenna being connected to said upper bus bar and said lower bus bar;

said plurality of electrode taps being disposed between said upper bus bar and said lower bus bar and being connected to said upper bus bar and said lower bus bar;

a transmitter generating an expanded FM chirp waveform;

said plurality of electrode taps being spaced at predetermined distances from each other establishing a time-ordered code;

said input chirped SAW transducer, receiving said expanded FM chirp waveform as an expanded input chirp signal through said antenna and compressing said input expanded chirp signal into a narrow, compressed pulse signal propagating toward said plurality of electrode taps;

said plurality of electrode taps producing a plurality of narrow, compressed pulse samples propagating a time-ordered pulse train output to said antenna; and said antenna transmitting a time-ordered pulse train output signal back to a means for interrogation identifying said SAW-ID tag device.

2. An SAW-ID tag device as recited in claim 1, wherein:

said upper bus bar and said lower bus bar extend in a generally linear fashion;

said upper bus bar and said lower bus bar run substantially parallel to each other; and said plurality of electrode taps are orthogonally disposed between said upper bus bar and said lower bus bar.

3. An SAW-ID tag device as recited in claim 2, wherein said piezoelectric substrate is quartz.

4. An SAW-ID tag device as recited in claim 3, wherein said antenna is a dipole antenna.

5. An SAW-ID tag device as recited in claim 3, wherein said antenna is a loop antenna.

6. An SAW-ID tag device as recited in claim 4, further comprising combining said means for interrogation with said transmitter.

7. An SAW-ID tag device as recited in claim 6, further comprising placing said transmitter in proximity to said SAW-ID tag device.

8. An SAW-ID tag device, as recited in claim 7, wherein:

said input chirped SAW transducer is disposed on said top surface of the piezoelectric substrate in proximity to said antenna; and said input chirped SAW transducer is spaced sufficiently away from said plurality of electrode taps to prevent said narrow, compressed pulse signal from overlapping in time with said plurality of narrow, compressed pulse samples.

9. An SAW-ID tag device as recited in claim 8, further comprising said electrode taps being separated by a separation spacing, $T_n$, where n is an integer.

10. An SAW-ID tag device, comprising:

a piezoelectric quartz substrate having a top surface and a bottom surface;

an upper bus bar, a lower bus bar, five electrode taps, a built-in antenna and an input chirped SAW transducer disposed on said top surface of the piezoelectric quartz substrate;

said input chirped SAW transducer being capable of providing a dispersive, complementary matched filter response to a chirp waveform input signal and being connected to said upper bus bar and said lower bus bar;

said upper bus bar and said lower bus bar extending in a generally linear fashion and running substantially parallel to each other;

said five electrode taps being connected to said upper bus bar and said lower bus bar;

said five electrode taps being orthogonally disposed between said upper bus bar and said lower bus bar and being spaced at a plurality of predetermined distances from each other establishing a time-ordered code;

a transmitter placed in proximity to said piezoelectric quartz substrate generating an expanded FM chirp waveform;

said input chirped SAW transducer receiving said expanded FM chirp waveform as an expanded input chirp signal through said antenna and compressing said expanded input chirp signal into a narrow, compressed pulse signal which propagates toward said five electrode taps;

said five electrode taps producing five narrow, compressed pulse samples propagating a time-ordered pulse train output to said antenna; and said antenna transmitting a time-ordered pulse train output signal back to a means for interrogation identifying said SAW-ID tag device.

11. An SAW-ID tag device as recited in claim 10, wherein said antenna is a dipole antenna.

12. An SAW-ID tag device as recited in claim 10, wherein said antenna is a loop antenna.

13. An SAW-ID tag device as recited in claim 11, further comprising combining said means for interrogation with said transmitter.

14. An SAW-ID tag device as recited in claim 13, further comprising placing said transmitter in proximity to said SAW-ID tag device.

15. An SAW-ID tag device as recited in claim 14, wherein:

said input chirped SAW transducer is disposed on said top surface of the piezoelectric quartz substrate in proximity to said antenna.

16. An SAW-ID tag device as recited in claim 15, wherein:

said input SAW transducer is spaced sufficiently away from said five electrode taps to prevent said narrow, compressed signal from overlapping in time with said five narrow, compressed pulse samples.

17. An SAW-ID tag device, as recited in claim 16, wherein said piezoelectric substrate is a material having temperature-stable characteristics other than quartz.

18. A method of identifying articles using an SAW-ID tag device, comprising the steps of:

selecting a piezoelectric substrate having a polished top surface, a bottom surface and temperature-stable characteristics;

forming an input chirped SAW transducer being capable of providing a dispersive, complementary matched filter response to a chirp waveform input signal on said top surface of the piezoelectric substrate;

connecting an upper bus bar and a lower bus bar to said input chirped SAW transducer on said top surface of the piezoelectric substrate and connecting a built-in antenna to said upper bus bar and said lower bus bar;

disposing a plurality of electrode taps between said upper bus bar and said lower bus bar;

spacing said electrode taps at selected distances from each other between said upper bus bar and lower bus bar, thereby determining a sequence of time-ordered signals forming a time-ordered code;

generating an expanded FM chirp waveform from a chirp transmitter as an expanded input chirp signal;

feeding said expanded input chirp signal through said antenna to said input chirped SAW transducer, said input chirped SAW transducer having a dispersive, complementary matched filter response to said expanded input chirp signal;

compressing said input expanded chirp signal into a narrow, compressed pulse signal;

propagating said narrow, compressed pulse signal toward said plurality of electrode taps forming said time-ordered code;

allowing said plurality of electrode taps to sample said narrow, compressed pulse signal in order to produce a plurality of narrow, compressed pulse samples; and propagating a uniquely coded time-ordered pulse train output through said antenna back to a means for interrogation identifying the SAW-ID tagged article.

19. A method of identifying articles using an SAW-ID tag device as recited in claim 18, further comprising forming said piezoelectric substrate of quartz.

20. A method of identifying articles using an SAW-ID tag device as recited in claim 19, further comprising the steps of:

disposing said plurality of electrode taps orthogonally between said upper bus bar and said lower bus bar; and forming said upper bus bar and said lower bus bar in a generally linear fashion running substantially parallel to each other.

21. A method of identifying articles using an SAW-ID tag device as recited in claim 20, further comprising the steps of:

forming said input chirped SAW transducer on said top surface of the piezoelectric substrate in close proximity to said antenna; and spacing said input chirped SAW transducer sufficiently away from said plurality of electrode taps to prevent said narrow, compressed pulse signal from overlapping in time with said plurality of narrow, compressed pulse samples.

22. A method of identifying articles using an SAW-ID tag device, as recited in claim 21, further comprising the step of locating said transmitter in proximity to said SAW-ID tag device.

23. A method of identifying articles using an SAW-ID tag device as recited in claim 22, further comprising the step of combining said means for interrogation with said transmitter.

24. A method of identifying articles using an SAW-ID tag device as recited in claim 23, wherein said antenna connected to said upper bus bar and said lower bus bar is a dipole antenna.

25. A method of identifying articles using an SAW-ID tag device as recited in claim 23, wherein said antenna connected to said upper bus bar and said lower bus bar is a loop antenna.

26. A method of identifying articles using an SAW-ID tag device comprising the steps of:

selecting a piezoelectric substrate having a polished top surface, a bottom surface and temperature-stable characteristics;

forming an input chirped SAW transducer being capable of providing a dispersive, complementary matched filter response to a chirp waveform input signal on said top surface of the piezoelectric substrate;

connecting an upper bus bar and a lower bus bar to said input chirped SAW transducer on said top surface of the piezoelectric substrate and connecting a built-in antenna to said upper bus bar and said lower bus bar;

disposing a plurality of electrode taps between said upper bus bar and said lower bus bar;

forming a plurality of connected electrode taps from said plurality of electrode taps with a plurality of upper connective portions connecting each of said plurality of connected electrode taps to said upper bus bar and a plurality of lower connective portions connecting each of said plurality of connected electrode taps to said lower bus bar;

selectively disconnecting a predetermined number of said plurality of connected electrode taps from said upper bus bar and said lower bus bar with a cutting means forming a set of operational electrode taps;

said set of operational electrode taps determining said sequence of time-ordered signals forming said time-ordered code;

generating an expanded FM chirp waveform from a chirp transmitter as an expanded input chirp signal;

feeding said input expanded chirp signal through said antenna to said input chirped SAW transducer;

compressing said input expanded chirp signal into a narrow, compressed pulse signal;

propagating said narrow, compressed pulse signal toward said set of operational electrode taps forming said time-ordered code;

allowing said set of operational electrode taps to sample said narrow, compressed pulse signal in order to produce a plurality of narrow, compressed pulse samples; and propagating a uniquely coded time-ordered pulse train output through said antenna back to a means for interrogation identifying the SAW-ID tagged article.

27. A method of identifying articles using an SAW-ID tag device as recited in claim 26, further comprising the steps of:

disposing said set of operational electrode taps orthogonally between said upper bus bar and said lower bus bar; and forming said upper bus bar and said lower bus bar in a generally linear fashion running substantially parallel to each other.

28. A method of identifying articles using an SAW-ID tag device as recited in claim 27, further comprising forming said piezoelectric substrate of quartz.

29. A method of identifying articles using an SAW-ID tag device as recited in claim 28, further comprising the steps of:

forming said input chirped SAW transducer on said top surface of the piezoelectric substrate in close proximity to said antenna; and spacing said input chirped SAW transducer sufficiently away from said set of operational electrode taps to prevent said narrow, compressed pulse signal from overlapping in time with said plurality of narrow, compressed pulse samples.

30. A method of identifying articles using an SAW-ID tag device, as recited in claim 29, further comprising the step of locating said transmitter in proximity to said SAW-ID tag device.

31. A method of identifying articles using an SAW-ID tag device as recited in claim 30, further comprising the step of combining said means for interrogation with said transmitter.

32. A method of identifying articles using an SAW-ID tag device as recited in claim 31, wherein said antenna connected to said upper bus bar and said lower bus bar is a dipole antenna.

33. A method of identifying articles using an SAW-ID tag device as recited in claim 31, wherein said antenna connected to said upper bus bar and said lower bus bar is a loop antenna.

34. A method of identifying articles using an SAW-ID tag device as recited in claim 32, wherein said plurality of upper connective portions and said plurality of lower connective portions are formed of a metallic conductive wire.

35. A method of identifying articles using an SAW-ID tag device as recited in claim 34, wherein said plurality of upper connective portions and said plurality of lower connective portions are formed of an identical thin-film conductive material as said input chirped SAW transducer, said set of operational electrode taps, said upper bus bar and said lower bus bar.

36. A method of identifying articles using an SAW-ID tag device as recited in claim 35, wherein said thin-film conductive material is aluminum.

37. A method of identifying articles using an SAW-ID tag device, as recited in claim 36, wherein the cutting means is a laser scribe.

38. A method of identifying articles using an SAW-ID tag device, comprising the steps of:

selecting a piezoelectric substrate having a polished top surface, a bottom surface and temperature-stable characteristics;

forming an input chirped SAW transducer being capable of providing a dispersive, complementary matched filter response to a chirp waveform input signal on said top surface of the piezoelectric substrate;

connecting an upper bus bar and a lower bus bar to said input chirped SAW transducer on said top surface of the piezoelectric substrate and connecting a built-in antenna to said upper bus bar and said lower bus bar;

forming a plurality of electrode taps having a plurality of top conductive wire bonds and a plurality of bottom conductive wire bonds;

forming said upper bus bar and said lower bus bar in a generally linear fashion running substantially parallel to each other, having a plurality of opposing slots dimensioned to accept said plurality of top conductive wire bonds bridging said opposing slots of the upper bus bar and to accept said plurality of bottom conductive wire bonds bridging said opposing slots of the lower bus bar;

disposing said plurality of electrode taps between said upper bus bar and said lower bus bar;

forming a plurality of connected electrode taps by selectively connecting said plurality of top conductive wire bonds to said upper bus bar and said plurality of bottom conductive wire bonds to said lower bus bar;

spacing said plurality of connected electrode taps at selected distances from each other between said upper bus bar and lower bus bar, thereby determining a sequence of time-ordered signals forming a time-ordered code;

generating an expanded FM chirp waveform from a chirp transmitter as an expanded input chirp signal;

feeding said expanded input chirp signal through said antenna to said input chirped SAW transducer;

compressing said expanded input chirp signal into a narrow, compressed pulse signal;

propagating said narrow, compressed pulse signal toward said plurality of connected electrode taps forming said time-ordered code;

allowing said plurality of connected electrode taps to sample said narrow, compressed pulse signal in order to produce a plurality of narrow, compressed pulse samples; and propagating a uniquely coded time-ordered pulse train output through said antenna back to a means for interrogation identifying the SAW-ID tagged article.

39. A method of identifying articles using an SAW-ID tag device as recited in claim 38, further comprising forming said piezoelectric substrate of quartz.

40. A method of identifying articles using an SAW-ID tag device as recited in claim 39, further comprising the step of disposing said plurality of connected electrode taps orthogonally between said upper bus bar and said lower bus bar.

41. A method of identifying articles using an SAW-ID tag device as recited in claim 40, further comprising the steps of:

forming said input chirped SAW transducer on said top surface of the piezoelectric substrate in close proximity to said antenna; and spacing said input chirped SAW transducer sufficiently away from said plurality of connected electrode taps to prevent said narrow; compressed pulse signal from overlapping in time with said plurality of narrow, compressed pulse samples.

42. A method of identifying articles using an SAW-ID tag device, as recited in claim 41, further comprising the step of locating said transmitter in proximity to said SAW-ID tag device.

43. A method of identifying articles using an SAW-ID tag device as recited in claim 42, further comprising the step of combining said means for interrogation with said transmitter.

44. A method of identifying articles using an SAW-ID tag device as recited in claim 43, wherein said antenna connected to said upper bus bar and lower bus bar is a dipole antenna.

45. A method of identifying articles using an SAW-ID tag device as recited in claim 43, wherein said antenna connected to said upper bus bar and lower bus bar is a loop antenna.

46. A method of identifying articles using an SAW-ID tag device as recited in claim 44, wherein said plurality of top conductive wire bonds and said plurality of bottom conductive wire bonds are formed of a metallic conductive material.

47. A method of identifying articles using an SAW-ID tag device as recited in claim 46, wherein said plurality of top conductive wire bonds and said plurality of bottom conductive wire bonds are formed of an identical thin-film conductive material as said input chirped SAW transducer, said set of operational electrode taps, said upper bus bar and said lower bus bar.

48. A method of identifying articles using an SAW-ID tag device as recited in claim 47, wherein said thin-film conductive material is aluminum.

* * * * *